(12) United States Patent
Liu et al.

(10) Patent No.: US 10,789,400 B2
(45) Date of Patent: *Sep. 29, 2020

(54) SCHEDULING SIMULTANEOUS OPTIMIZATION OF MULTIPLE VERY-LARGE-SCALE-INTEGRATION DESIGNS

(71) Applicant: INTERNATIONAL BUSINESS MACHINES CORPORATION, Armonk, NY (US)

(72) Inventors: Hung-Yi Liu, Hillsboro, OR (US); Matthew M. Ziegler, Sleepy Hollow, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/038,503

(22) Filed: Jul. 18, 2018

(65) Prior Publication Data
US 2018/0322226 A1 Nov. 8, 2018

Related U.S. Application Data (63) Continuation of application No. 15/352,895, filed on Nov. 16, 2016, now Pat. No. 10,083,268, which is a continuation of application No. 14/861,697, filed on Sep. 22, 2015, now Pat. No. 9,600,623.

(51) Int. Cl.
G06F 17/50 (2006.01)
G06F 30/327 (2020.01)
G06F 30/398 (2020.01)

(52) U.S. Cl.
CPC .......... G06F 30/327 (2020.01); G06F 30/398 (2020.01)

(58) Field of Classification Search
CPC ............... G06F 17/505; G06F 17/5081; G06F 17/5068; G06F 17/5072; G06F 19/321; G06F 17/5077; G06F 17/5036; G06F 2217/84; G06F 30/327; G06F 30/398; G06F 30/39; G06F 30/392; G06F 30/394; G06F 30/367; G06F 2119/12; G16H 10/60; G16H 50/50; G16H 50/20; H04N 9/87; G06N 20/00
USPC ................................................ 716/100–106
See application file for complete search history.

(56) References Cited

U.S. PATENT DOCUMENTS

| | | | |
|---|---|---|---|
| 6,466,898 B1 | 10/2002 | Chan | |
| 6,782,511 B1 | 8/2004 | Frank et al. | |
| 7,404,172 B2 | 7/2008 | Wong et al. | |
| 8,418,094 B2 | 4/2013 | Pedenon et al. | |
| 9,600,623 B1 * | 3/2017 | Liu | G06F 17/5081 |
| 10,083,268 B2 * | 9/2018 | Liu | G06F 17/5081 |
| 2002/0078422 A1 | 6/2002 | Bradley et al. | |
| 2005/0050501 A1 | 3/2005 | Allen et al. | |
| 2005/0132320 A1 | 6/2005 | Allen et al. | |
| 2008/0276209 A1 | 11/2008 | Albrecht et al. | |
| 2008/0276210 A1 * | 11/2008 | Albrecht | G06F 30/30 716/113 |
| 2015/0121319 A1 | 4/2015 | Hutton et al. | |
| 2015/0347641 A1 * | 12/2015 | Gristede | G06F 30/327 716/104 |
| 2016/0147916 A1 * | 5/2016 | Liu | G06F 17/5081 716/104 |

FOREIGN PATENT DOCUMENTS

EP 752677 1/1997

OTHER PUBLICATIONS

M. M. Ziegler, G. D. Gristede, V. V. Zyuban, "Power Reduction by Aggressive Synthesis Design Space Exploration," International Symposium on Low Power Electronic Design (ISLPED) 2013, pp. 421-426.
M. M. Ziegler, et al., "POWER8 Design Methodology Innovations for Improving Productivity and Reducing Power," IEEE Custom Integrated Circuit Conference (CICC), Sep. 2014, total pp. 8.
A. Arcuri, G. Fraser, "Parameter Tuning or Default Values? an Empirical Investigation in Search-Based Software Engineering", Empirical Software Engineering, Jun. 2013, vol. 18, Issue 3, pp. 594-623.
Catherine H. Gebotys, "Optimal Scheduling and Allocation of Embedded VLSI Chips", IEEE, 1992, pp. 116-119.
Paul J. Otterstedt, List of IBM Patents or Patent Applications Treated As Related, May 15, 2020, pp. 1-2.

* cited by examiner

*Primary Examiner* — Binh C Tat
(74) *Attorney, Agent, or Firm* — Daniel Morris; Otterstedt, Wallace & Kammer, LLP (57) ABSTRACT

A computer-implemented method obtains data describing a plurality of synthesis scenarios associated with a very-large-scale integration design (VLSI), wherein each synthesis scenario describes a different combination of tunable design parameters for a macro of the VLSI design, and wherein the VLSI design includes a plurality of macros being tuned. The plurality of macros is ranked based on the data. The ranking produces a macro waiting list that identifies those of the synthesis scenarios that are associated with each of the macros. A subset of the synthesis scenarios is pushed from the macro waiting list to a job submission queue that is separate from the macro waiting list. The job submission queue ranks the subset of synthesis scenarios in an order in which they are to be synthesized by a synthesis tuning system. At least one synthesis scenario is submitted to the synthesis tuning system according to the order.

20 Claims, 7 Drawing Sheets

SCHEDULING SIMULTANEOUS OPTIMIZATION OF MULTIPLE VERY-LARGE-SCALE-INTEGRATION DESIGNS

BACKGROUND OF THE INVENTION

The present invention relates generally to integrated circuit design and relates more specifically to automatic synthesis for very-large-scale integration.

Very-large-scale integration (VLSI) is the process of creating an integrated circuit (IC) by combining thousands of transistors into a single chip. The VLSI process seeks to balance multiple objectives relating to design parameters such as power, timing, area, and the like. The process of tuning the design parameters in order to find the right balance is known as design space exploration (DSE), which is an iterative refinement process. DSE may be aided by automatic synthesis tools, which may provide up to thousands of parameters for DSE.

SUMMARY OF THE INVENTION

In one embodiment, a computer-implemented method includes obtaining data describing a plurality of synthesis scenarios associated with a very-large-scale integration design, wherein each synthesis scenario of the plurality of synthesis scenarios describes a different combination of tunable design parameters for a macro of the very-large-scale integration design, and wherein the very-large-scale integration design includes a plurality of macros being tuned, ranking the plurality of macros based on the data, wherein the ranking produces a macro waiting list, and wherein the macro waiting list identifies those of the plurality of synthesis scenarios that are associated with each of the plurality of macros, pushing a subset of the plurality of synthesis scenarios from the macro waiting list to a job submission queue that is separate from the macro waiting list, wherein the job submission queue ranks the subset of the plurality of synthesis scenarios in an order in which the subset of the plurality of synthesis scenarios is to be synthesized by a synthesis tuning system, and submitting at least one synthesis scenario of the subset of the plurality of synthesis scenarios to the synthesis tuning system according to the order.

In another embodiment, a machine-readable storage medium is encoded with instructions executable by a processor. The machine-readable storage medium includes instructions to rank a plurality of macros of a very-large-scale integration design based on data describing a plurality of synthesis scenarios, wherein each synthesis scenario of the plurality of synthesis scenarios describes a different combination of tunable design parameters for a macro of the plurality of macros, wherein the plurality of macros is being tuned, and wherein the ranking produces a macro waiting list, instructions to push a subset of the plurality of synthesis scenarios to a job submission queue that is separate from the macro waiting list, wherein the job submission queue ranks the subset of the plurality of synthesis scenarios in an order in which the subset of the plurality of synthesis scenarios is to be synthesized by a synthesis tuning system, and instructions to submit at least one synthesis scenario of the subset of the plurality of synthesis scenarios to the synthesis tuning system according to the updated order.

BRIEF DESCRIPTION OF THE DRAWINGS

So that the manner in which the above recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In one embodiment, a method, machine readable storage medium, and apparatus for scheduling simultaneous optimization of multiple very-large-scale integration designs is disclosed. Design space exploration of VLSI designs may be aided by automatic synthesis tools. These automatic synthesis tools may provide up to thousands of parameters—such as logic restructuring, cell swapping and sizing, placement and routing algorithms, and the like—that can be tuned to optimize various design objectives. However, synthesizing every possible parameter or combination of parameters (the effectiveness of which is design-specific) is typically infeasible. For instance, even a set of only twenty parameters will yield $2^{20}$ (1,048,576) parameter combinations. Moreover, it can take hours or even days to synthesize a single parameter set.

Systems have been developed to facilitate the synthesis tuning process. For instance, International Business Machines Corporation (IBM)'s DSE-driven Synthesis Tuning System (SynTunSys) provides a tuning infrastructure that resides between macro designers and synthesis tools. Using SynTunSys, a human designer can manually monitor and schedule synthesis tuning on an individual macro (i.e., a sub-cell or module of the VLSI design). Embodiments of the disclosure build upon this tuning infrastructure to provide simultaneous synthesis scheduling of multiple macros being tuned (or undergoing logic changes) using a synthesis program, such as SynTunSys, in an autonomous manner.

Some embodiments of the disclosure simultaneously schedule synthesis tuning on multiple macros by prioritizing tuning runs on the macros that are determined to have the most tuning potential, with respect to some cost function. The prioritization of the macros can be updated dynamically as tuning progresses and/or as designs undergo logic changes. Embodiments of the invention simultaneously schedule tuning runs for as many macros as possible, while honoring resource constraints such as the number of available central processing units, the amount of available disk space, and the like.

Figure 1:
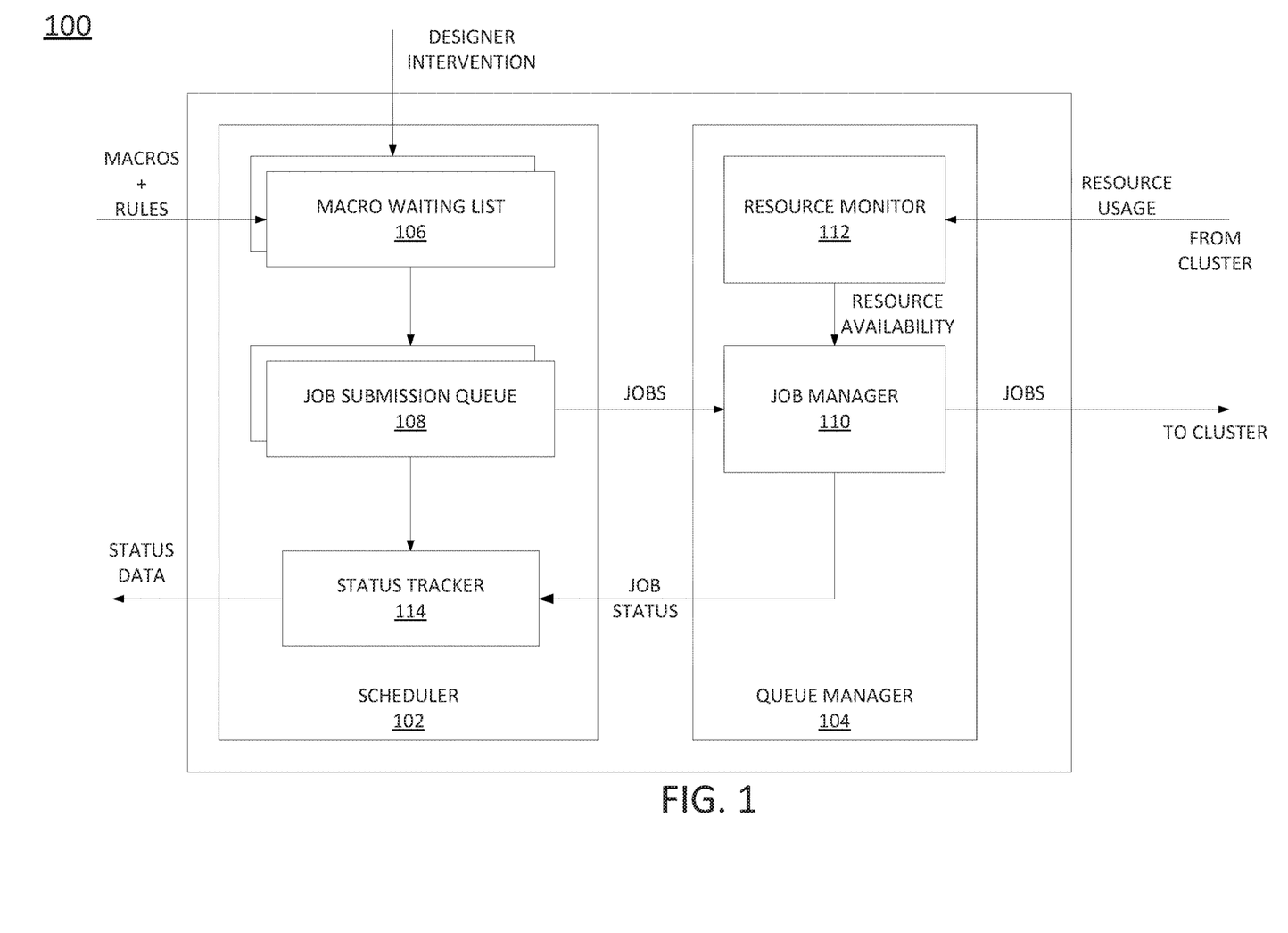
FIG. 1 is a block diagram illustrating one embodiment of a system for scheduling simultaneous optimization of multiple very-large-scale integration designs, according to the present disclosure.

FIG. 1 is a block diagram illustrating one embodiment of a system 100 for scheduling simultaneous optimization of multiple very-large-scale integration designs, according to the present disclosure. As illustrated, the system 100 generally comprises a scheduler 102 communicatively coupled to a separate queue manager 104.

The scheduler 102 may be implemented on a processor. The scheduler 102 receives user inputs, including macro data, synthesis program rules (e.g., rules from the SynTunSys system), scheduling options, and resource limits that are to be obeyed when scheduling tuning and synthesis of macros. The scheduler 102 uses the user inputs to initialize and maintain a macro waiting list 106 for macros currently under tuning. The macro waiting list 106 may be initialized (i.e., instantiated in accordance with an initial order of macros) in one or more of a plurality of ways, such as manually by a human macro designer, automatically by a sensitivity test, automatically by historical tuning results, or automatically by a "work on worst" basis that prioritizes macros based on a cost analysis from a prior synthesis run. The macro waiting list 106 can also be initialized by one or more automatic methods followed by manual adjustment by a human macro designer. The macro waiting list 106 may be updated (i.e., adjusted to reflect a new order of macros) at any time to reflect new user inputs and/or designer intervention. The macro waiting list 106 may be updated in one or more of a plurality of ways, such as manually by a human macro designer (e.g. by prioritizing macros for which logic changes have been made), automatically by evaluating the tuning potential of each macro, or automatically based on a periodic evaluation of a best new solution found for one or more of the macros. Different methods for initializing and updating the macro waiting list 106 are discussed in greater detail below.

In addition, the scheduler maintains a job submission queue 108 of synthesis jobs to be run. A "job" within this context may be a run of the synthesis tuning program (e.g., SynTunSys), a portion of a run of the synthesis tuning program, or a single synthesis scenario (i.e., a combination of effective synthesis parameters). Within the context of the SynTunSys program, synthesis parameters may be grouped into "primitives," or atomic combinations of synthesis parameters that allow design space reduction. In this case, a synthesis scenario may also comprise a primitive. Although the term "primitive" may be used herein to refer to atomic combinations of synthesis parameters, it will be appreciated that the use of this term does not limit applicability of the disclosed methods to the SynTunSys program only. The job submission queue 108 may be updated at any time based on updates to the macro waiting list 106. The job submission queue 108 may be updated across multiple macros in one or more of a plurality of ways, such as by static partitioning by a human macro designer (e.g., allow x % of the maximum number of concurrent jobs that can be run for tuning a given macro) or automatically by dynamic partitioning by the scheduler. Different methods for initializing and updating the job submission queue 108 are discussed in greater detail below.

The queue manager 104 may be implemented on a processor. Jobs are submitted from the job submission queue 108 to the queue manager 104. The queue manager 104 officially schedules the jobs in the job submission queue 108 for synthesis runs. To this end, the queue manager 104 includes a job manager 110 and a resource monitor 112. The job manager 110 receives jobs from the job submission queue and resource availability updates from the resource monitor 112 and uses this information to determine when to submit jobs to the cluster of machines that run the synthesis tuning program. The resource monitor 112 monitors resource usage by the cluster and reports the availability of resources to the queue manager 104.

A status tracker 114 of the scheduler 102 monitors the status of jobs that are submitted to the cluster and reports on the status (e.g., to a human macro designer).

Figure 2:
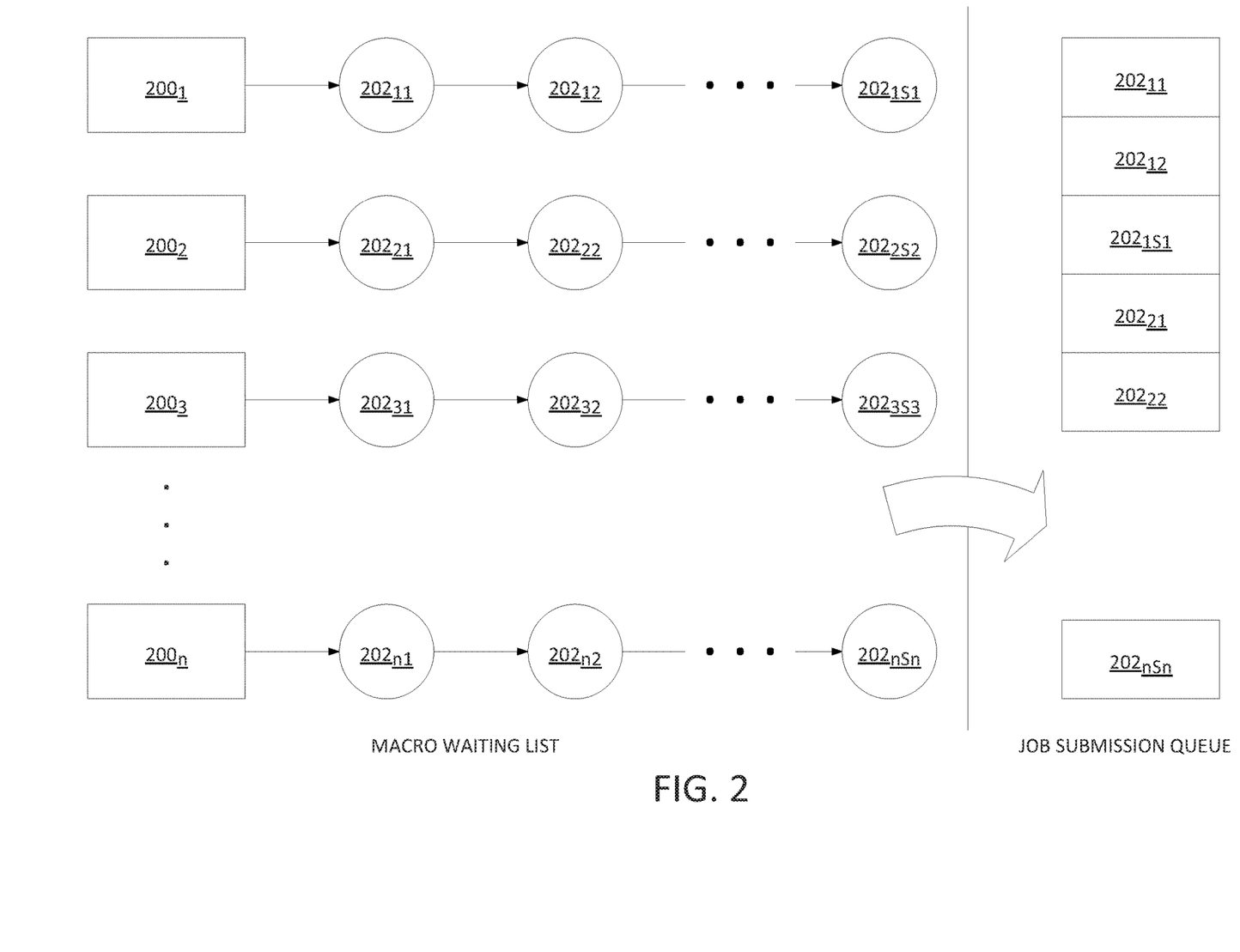
FIG. 2 illustrates an example of a macro waiting list and a job submission queue, such as might be maintained by the scheduler of FIG. 1.

FIG. 2 illustrates an example of a macro waiting list and a job submission queue, such as might be maintained by the scheduler 102 of FIG. 1. As illustrated, the macro waiting list comprises a plurality of macros $200_1$-$200_n$ (hereinafter collectively referred to as "macros 200"). Macro $200_1$ is positioned at the head of the macro waiting list, while macro $200_n$ is positioned at the tail of the macro waiting list. Each macro $200_i$ is associated with $s_i$ synthesis scenarios $202_{i1}$, $202_{i2}$, ..., $202_{in_i}$ (hereinafter collectively referred to as "synthesis scenarios 202"). The macro waiting list shows a scheduling order on a per-macro basis.

The corresponding job submission queue defines an order in which the synthesis scenarios 202 are scheduled for synthesis. In the illustrated example, the first-scheduled synthesis scenario is synthesis scenario $202_{11}$, while the last-scheduled synthesis scenario is synthesis scenario $202_{ns_n}$. In one embodiment, a limit is placed on the number of synthesis scenarios 202 that can be concurrently maintained in the job submission queue at any given time.

In some embodiments, the search space for a synthesis tuning run is reduced prior to the run. For instance, if there are roughly one thousand possible multi-valued parameters and roughly three hundred (and increasing) Boolean primitives in a primitive library, the search space might be reduced to approximately fifty primitives. The fifty primitives may be selected based on expected performance for target cost functions and/or on tuning effort. The expected performance may be estimated based, for example, on historical primitive performance (e.g., determined through data mining), on human macro designer knowledge and/or adjustment (e.g., to provide diversity), and/or on the introduction of new primitives that are expected to be promising but have not been used in enough runs to make an informed historical comparison. In one embodiment, the number of new primitives that can be selected is limited.

Figure 3:
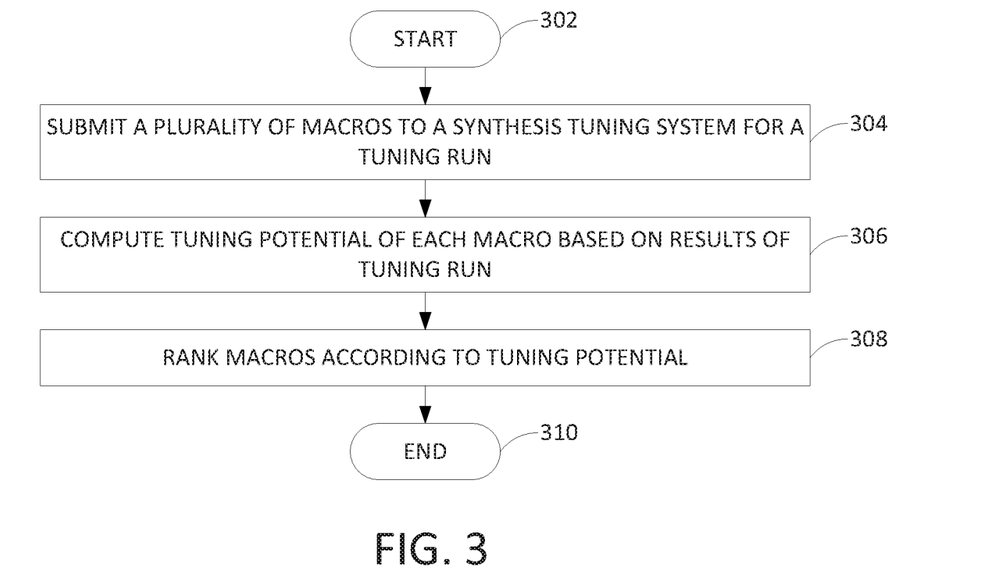
FIG. 3 is a flow diagram illustrating one example of a method for initializing a macro waiting list, such as the macro waiting list of FIG. 1.

FIG. 3 is a flow diagram illustrating one example of a method 300 for initializing a macro waiting list, such as the macro waiting list 106 of FIG. 1. In particular, the method 300 initializes a macro waiting list based on the results of a sensitivity test. The method 300 may be performed, for example, by the scheduler 102 of FIG. 1.

The method 300 begins in step 302. In step 304, a plurality of macros is submitted to a synthesis tuning system for a tuning run. In one embodiment, each of the macros is submitted for only one iteration or tuning run.

In step 306, the tuning potential of each macro is computed, based on the results of the tuning run or on a subset of scenarios from a tuning run. In one embodiment, the tuning potential of a macro is computed as the sum of the average quality of results (QoR) improvement of the optimal scenarios over the default scenario and the standard deviation of the improvements.

In step 308, the macros are ranked according to their respective tuning potentials. The ranked list becomes the initialized macro waiting list.

The method 300 ends in step 310.

Figure 4:
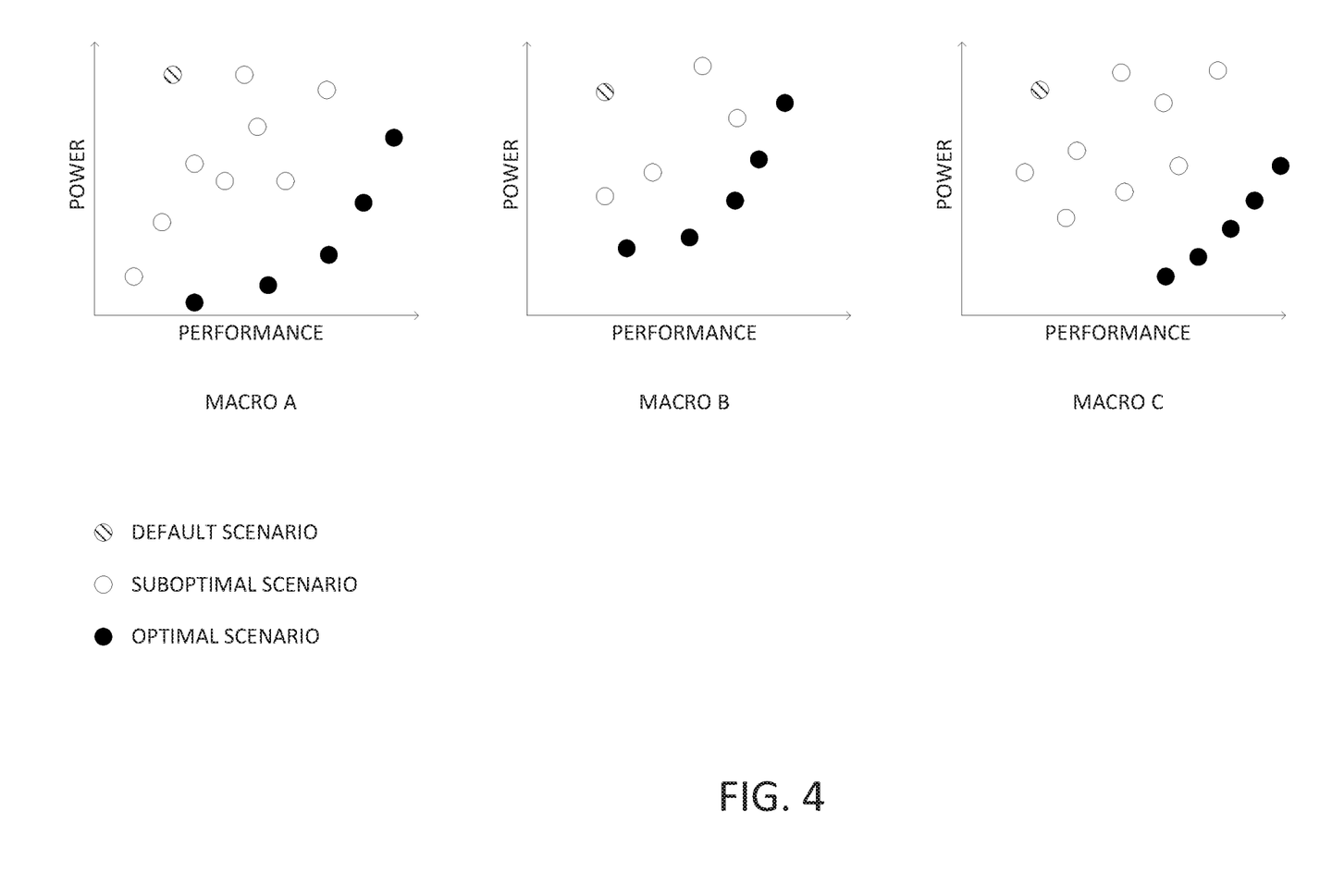
FIG. 4 illustrates the concept of tuning potential for three different example macros.

FIG. 4 illustrates the concept of tuning potential for three different example macros, labeled as macro A, macro B, and macro C. In particular, FIG. 4 includes three charts that plot the power versus performance for a respective one of the three example macros.

Based on the given examples, it can be seen that the tuning potential of macro A is greater than the tuning potential of macro B, because macro A demonstrates larger quality of results improvements (e.g., as indicated by the greater performance values). In addition, it can be seen that the tuning potential of macro A is also greater than the tuning potential of macro C, because macro A demonstrates a more diversified optimal quality of results (e.g., as indicated by the fact that macro A's optimal scenarios are more spread out than macro C's optimal scenarios). Thus, if one were to rank the three example macros in descending order according to tuning potential, macro A would be placed at the head of the macro waiting list.

Figure 5:
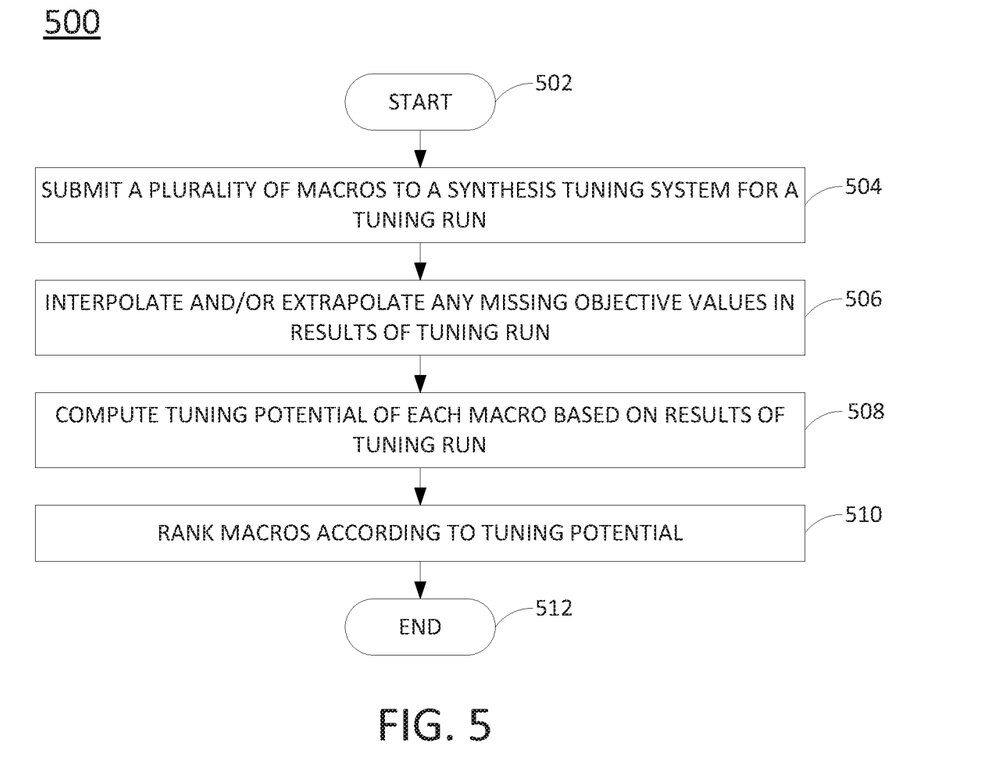
FIG. 5 is a flow diagram illustrating another example of a method for initializing a macro waiting list, such as the macro waiting list of FIG. 1.

FIG. 5 is a flow diagram illustrating another example of a method 500 for initializing a macro waiting list, such as the macro waiting list 106 of FIG. 1. In particular, the method 500 initializes a macro waiting list based on historical tuning results. The method 500 may be performed, for example, by the scheduler 102 of FIG. 1.

The method 500 begins in step 502. In step 504, a plurality of macros is submitted to a synthesis tuning system for a tuning run. In one embodiment, each of the macros is submitted for only one iteration or tuning run. In one embodiment, the tuning run is performed in accordance with a lightweight sensitivity test. This test calculates the similarity of two sequences of primitives by the length of their longest common subsequence. For instance, the longest common subsequence of "a b c d" and "a f d" is "a d" (i.e., the length longest common subsequence is equal to two). Higher-ranked primitives may be favored by calculating the length of the longest common subsequence weighted by the ranks of the primitives.

In step 506, any objective values that are missing from the results of the tuning run are interpolated and/or extrapolated.

In step 508, the tuning potential of each macro is computed, based on the results of the tuning run) which may have been supplemented with any missing objective values in accordance with step 506). In one embodiment, the tuning potential of a macro is computed as discussed above in connection with the method 300.

In step 510, the macros are ranked according to their respective tuning potentials. The ranked list becomes the initialized macro waiting list.

The method 500 ends in step 512.

Figure 6:
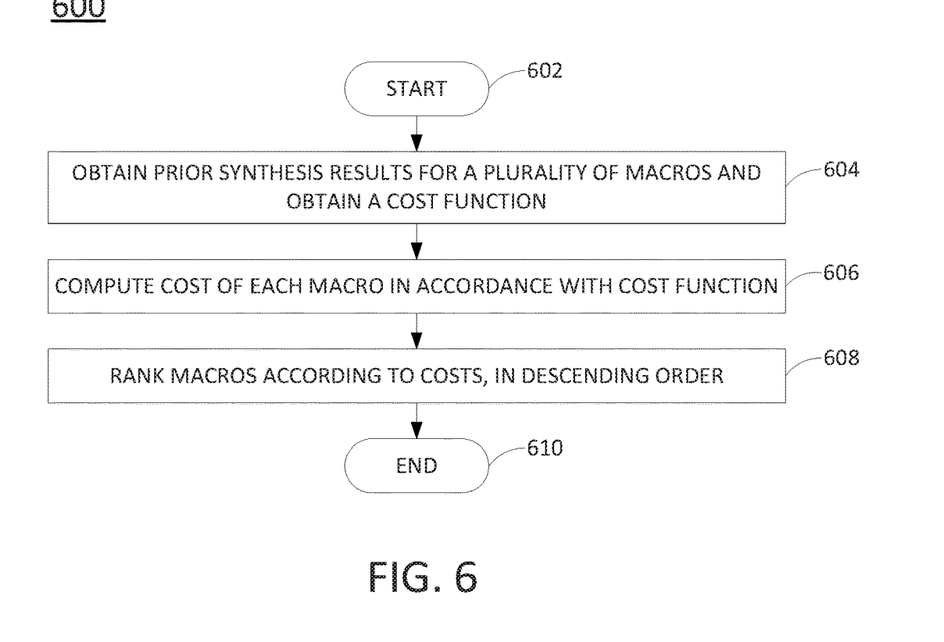
FIG. 6 is a flow diagram illustrating another example of a method for initializing a macro waiting list, such as the macro waiting list of FIG. 1.

FIG. 6 is a flow diagram illustrating another example of a method 600 for initializing a macro waiting list, such as the macro waiting list 106 of FIG. 1. In particular, the method 600 initializes a macro waiting list based on "work on worst" basis that prioritizes macros based on a cost analysis from a prior synthesis run. The method 600 may be performed, for example, by the scheduler 102 of FIG. 1.

The method 600 begins in step 602. In step 604, prior synthesis results for a plurality of macros are obtained, along with a cost function. In one example, the cost function is some metric associated with the performance of the macros (e.g., timing, power consumption, or some other metric or combination of metrics). The prior results and cost function may be obtained from storage or from a human macro designer.

In one particular example, the cost function is a user-defined normalized weighted sum of cost metrics and may be expressed as:

$$\text{Cost} = \sum_{i=1}^{m} W_i \times \text{Norm}(M_i) \quad \text{(EQN. 1)}$$

Where $M_i$ is the $i^{th}$ metric in the set of m cost metrics and $W_i$ is the relative weight assigned to the metric $M_i$. As an example, the set of cost metrics might include design parameters such as stability, power, and timing. In one embodiment, raw costs are linearly normalized to [0.0, 1.0], corresponding to [best, worst] costs.

In another example, the cost is not normalized, but is computed relative to the average of the value of the metrics across all of the macros. In this case, the cost function may be expressed as:

$$\text{Cost} = \sum_{i=1}^{m} W_i \times \left( M_i / Avg(M_{i_{allmacros}}) \right) \quad \text{(EQN. 2)}$$

Where $M_i$ is the $i^{th}$ metric in the set of m cost metrics and $W_i$ is the relative weight assigned to the metric $M_i$. As an example, the set of cost metrics might include stability, power, and timing.

Referring back to FIG. 6, in step 606, the costs of each macro are computed in accordance with the cost function in order to determine which macros are the "worst" (e.g., most negative timing, highest power consumption, or some other metric or combination of metrics).

In step 608, the macros are ranked according to their respective costs. The ranked list becomes the initialized macro waiting list. In a "work on worst" case, the macros are ranked in descending order, from highest cost to lowest cost, such that the "worst" macro (i.e., the macro with the highest cost according to the cost function) is at the head of the macro waiting list.

The method 600 ends in step 610.

Figure 7:
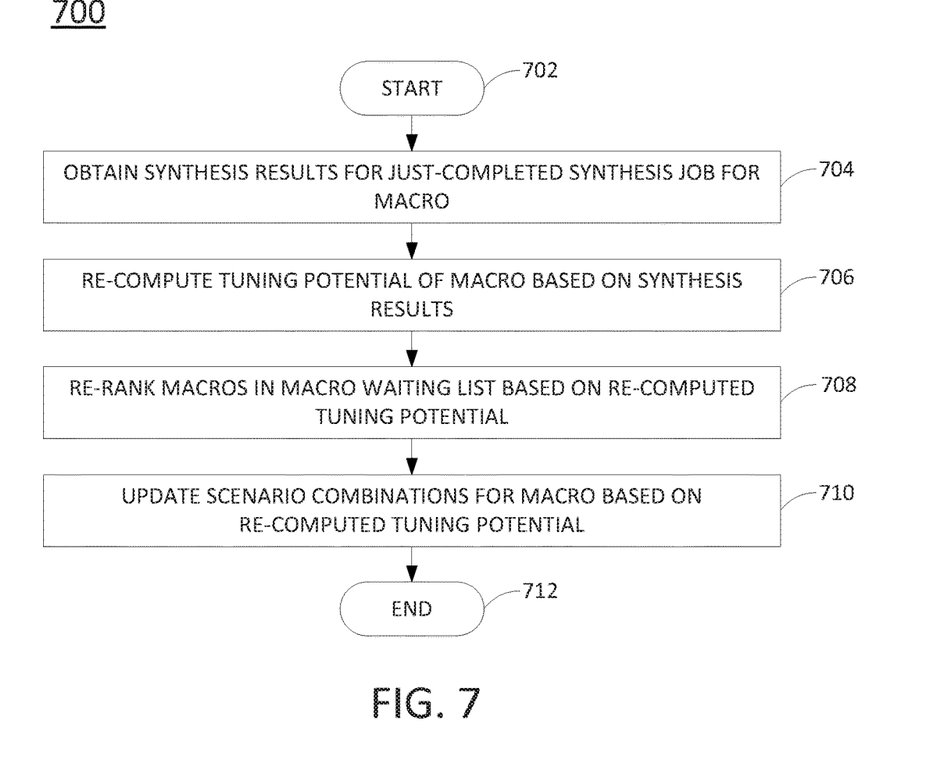
FIG. 7 is a flow diagram illustrating one example of a method for updating a macro waiting list, such as the macro waiting list of FIG. 1.

FIG. 7 is a flow diagram illustrating one example of a method 700 for updating a macro waiting list, such as the macro waiting list 106 of FIG. 1. In particular, the method 700 updates a macro waiting list based on the current tuning potential of the macros in the macro waiting list. The method 700 may be performed, for example, by the scheduler 102 of FIG. 1.

The method 700 begins in step 702. In step 704, the synthesis results for a just-completed synthesis job for a macro are obtained.

In step 706, the tuning potential of the macro is re-computed, based on the synthesis results obtained in step 704. The tuning potential may be computed as described above.

In step 708, the macro waiting list is re-ranked, based on the re-computed tuning potential of the macro. For instance, the re-computed tuning potential may cause the macro to be moved up or down on the macro waiting list, depending upon the way in which the macros are ranked.

In step 710, the scenario combinations relating to the macro are updated in accordance with the re-computed tuning potential.

The method 700 ends in step 712.

Figure 8:
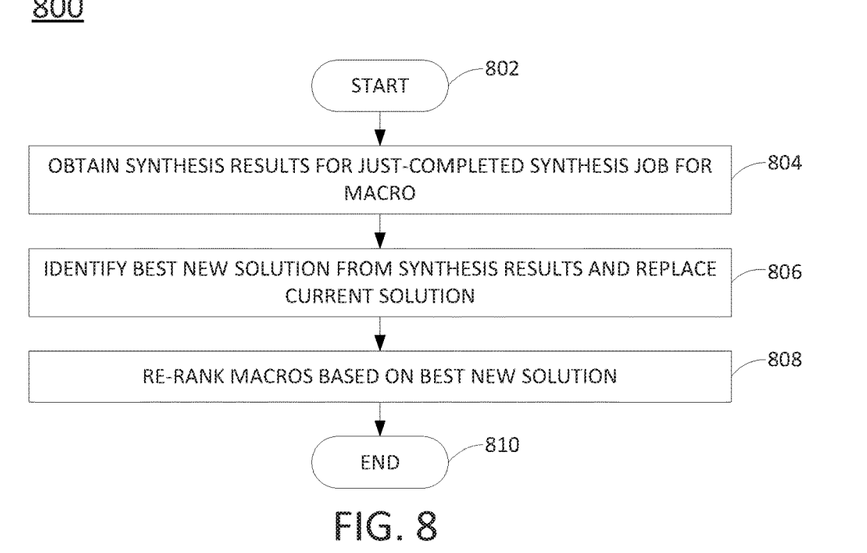
FIG. 8 is a flow diagram illustrating another example of a method for updating a macro waiting list, such as the macro waiting list of FIG. 1.

FIG. 8 is a flow diagram illustrating another example of a method 800 for updating a macro waiting list, such as the macro waiting list 106 of FIG. 1. In particular, the method 800 updates a macro waiting list based on the best solutions for the macros in the macro waiting list. The method 800 may be performed, for example, by the scheduler 102 of FIG. 1.

The method 800 begins in step 802. In step 804, the synthesis results for a just-completed synthesis job for a macro are obtained.

In step 806, a best new solution for the macro is identified, based on the synthesis results obtained in step 804. For instance, if a lowest cost solution is desired, a new solution may be achieved during the just-completed synthesis job whose cost is lower than the solution currently used to rank the macro. The best new solution thus replaces the current solution.

In step 808, the macro waiting list is re-ranked, based on the best new solution for the macro. For instance, the best new solution may cause the macro to be moved up or down on the macro waiting list, depending upon the way in which the macros are ranked.

The method 800 ends in step 812.

Figure 9:
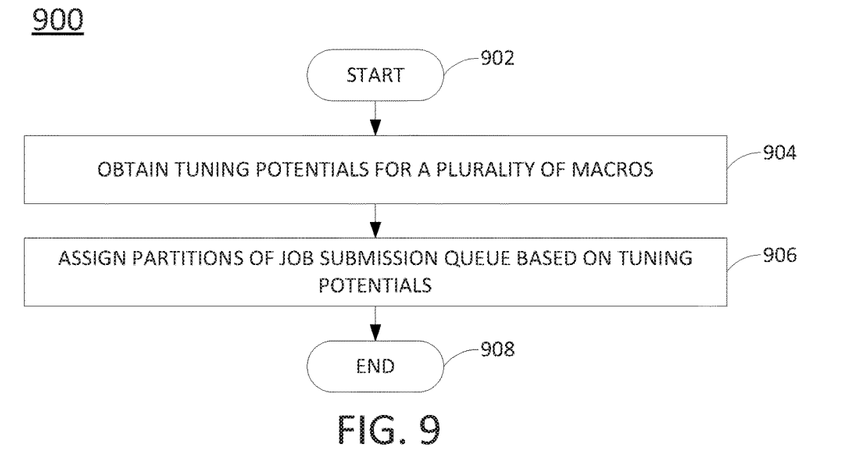
FIG. 9 is a flow diagram illustrating one example of a method for updating a job submission queue, such as the job submission queue of FIG. 1.

FIG. 9 is a flow diagram illustrating one example of a method 900 for updating a job submission queue, such as the job submission queue 108 of FIG. 1. In particular, the method 900 updates a job submission queue by dynamically partitioning the maximum number of concurrent jobs that can be managed by the job submission queue. The method 900 may be performed, for example, by the scheduler 102 of FIG. 1.

The method 900 begins in step 902. In step 904, the tuning potentials $TP_1, TP_2, \ldots TP_n$ for n macros are obtained. The tuning potentials may be computed as discussed above.

In step 906, the partitions in the job submission queue are assigned based on the tuning potentials. In one embodiment, the $i^{th}$ partition $P_i$ (where i=1 to n) is assigned according to:

$$P_i = TP_i / \sum_{i=1}^{n} \{TP_i\}$$

The method 900 ends in step 908.

Figure 10:
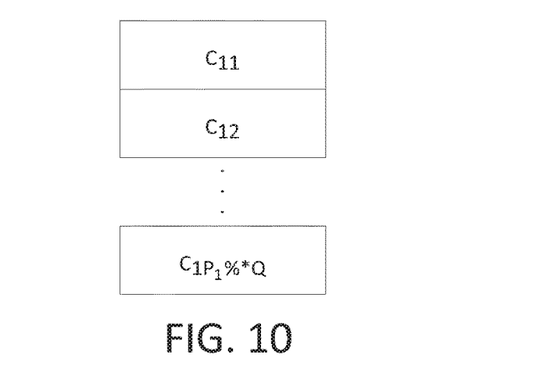
FIG. 10 illustrates a portion of an example job submission queue.

According to the macro waiting list (moving from head to tail), $P_i$% of the maximum number of concurrent jobs is sequentially removed from a given macro $M_i$ and pushed to the job submission queue, until the job submission queue contains the maximum number of concurrent jobs. FIG. 10 illustrates a portion of an example job submission queue whose total size (maximum number of concurrent jobs) is represented by Q. The illustrated portion of the job submission queue stores P %*Q jobs to be run for tuning the example macro $M_1$. $C_{1i}$ in this illustration is a particular synthesis scenario for the macro $M_1$.

Figure 11:
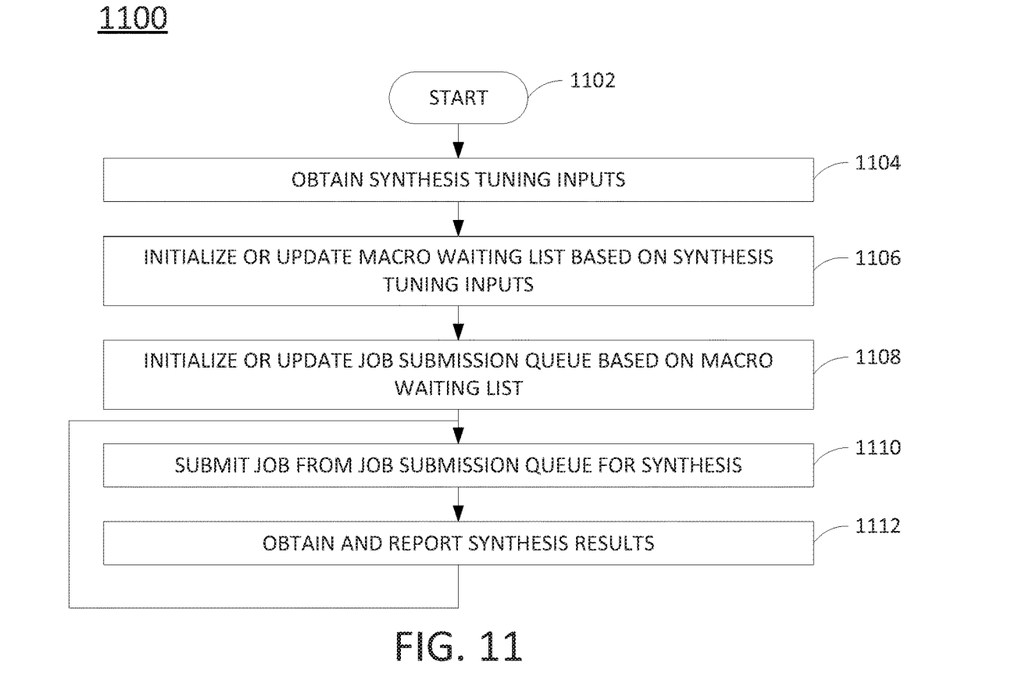
FIG. 11 is a flow diagram illustrating one example of a method for scheduling simultaneous optimization of multiple very-large-scale integration designs.

FIG. 11 is a flow diagram illustrating one example of a method 1100 for scheduling simultaneous optimization of multiple very-large-scale integration designs. The method may be carried out, for example, by the system 100 illustrated in FIG. 1.

The method 1100 begins in step 1102. In step 1104, one or more synthesis tuning inputs are obtained. The synthesis tuning inputs may include, for example, data relating to macros under tuning, synthesis tuning rules, scheduling options for scheduling synthesis of jobs, and any resource limits to be obeyed in scheduling jobs. The synthesis tuning inputs may be obtained, for example, from a human macro designer.

In step 1106, a macro waiting list is initialized or updated based on the synthesis tuning inputs. The macro waiting list may be initialized or updated in any of the manners described above. Updates may occur any time new synthesis tuning inputs become available or as a human macro designer chooses to intervene.

In step 1108, a job submission queue is initialized or updated based on the macro waiting list. The job submission queue list may be initialized or updated in any of the manners described above. Updates may occur any time in response to updates to the macro waiting list.

In step 1110, at least one job from the job submission queue is submitted to the cluster for synthesis. In one embodiment, jobs are submitted to the cluster in order, starting at the head of the job submission queue and continuing toward the tail.

In step 1112, results of the synthesis of the at least one job are obtained and reported (e.g., to a human macro designer). Step 1112 may also involve freeing cluster storage or other resources for a subsequent synthesis job.

The method 1100 then returns to step 1110 and submits the next job in the job submission queue for synthesis. The method 1100 continues to submit jobs and to monitor synthesis results until there are no jobs remaining in the job submission queue. During this time, updates to the macro waiting list and/or job submission queue may also occur, which may affect the order in which the jobs in the job submission queue are submitted for synthesis.

Other applications of the disclosed method and system for scheduling simultaneous optimization of multiple very-large-scale integration designs include an expansion to facilitate resource sharing among multiple users and/or multiple work sessions for a single user. Users of synthesis tuning systems often have fixed resource quotes with which to work (e.g., no more than x jobs can be running on the queue management system at a time). Embodiments of the disclosed invention can make use of resources from multiple users and/or work sessions by instantiating a slave process that designates resources as available for sharing and opens a "listener" process that waits for a master process to assign work. The master process can write "work orders" for slave processes that are run by other users. Data can be prepared for a slave process run by running master copies of the data to a writable area for a slave process or by running slave copies of the data locally. The slave process submits runs from other users' accounts, thereby completing work without impacting the master process's job quota.

Thus, the system 100 and methods 300, 500-900, and 1100 may operate in conjunction to schedule simultaneous optimization of multiple very-large-scale integration designs. Synthesis tuning may be simultaneously scheduled in an autonomous manner on multiple macros by prioritizing tuning runs on the macros that are determined to have the most tuning potential, with respect to some cost function. The prioritization of the macros can be updated dynamically as tuning progresses and/or as designs undergo logic changes. Embodiments of the invention simultaneously schedule tuning runs for as many macros as possible, while honoring resource constraints such as the number of available central processing units, the amount of available disk space, and the like.

The flowchart and block diagrams in the Figures illustrate the architecture, functionality, and operation of possible implementations of systems and methods according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

Examples of the present disclosure may be a system, a computer-implemented method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 12:
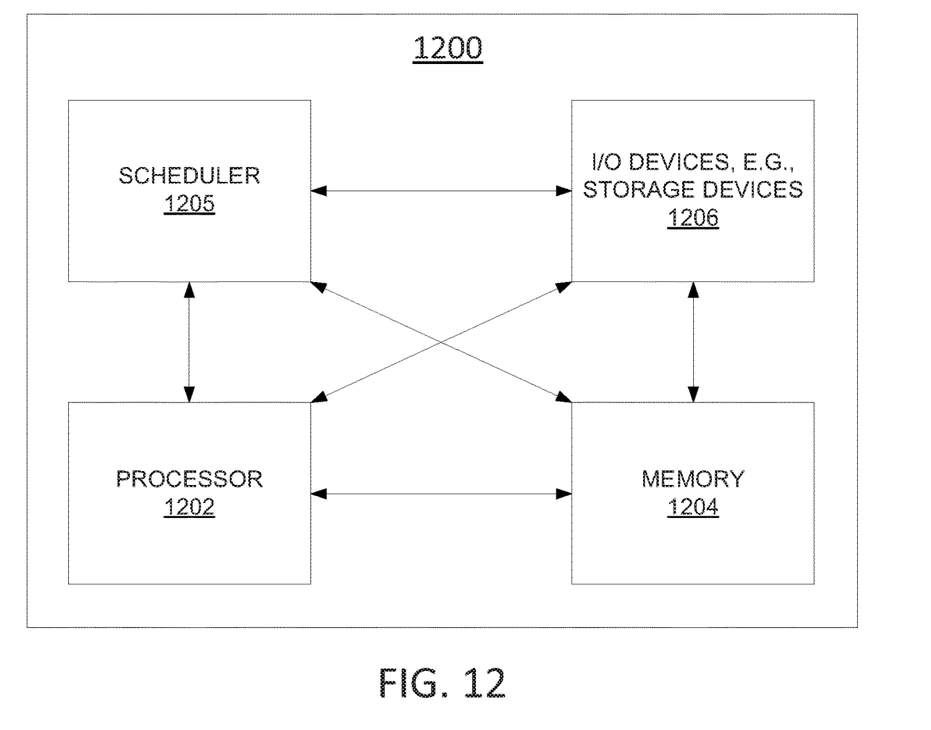
FIG. 12 depicts a high-level block diagram of a computer that can be transformed into a machine capable of performing the functions described herein.

FIG. 12, for example, depicts a high-level block diagram of a computer 1200 that can be transformed into a machine capable of performing the functions described herein. The computer 1200 may comprise, for example, part of the scheduler 102 discussed above in connection with FIG. 1. Notably, no computer or machine currently exists that performs the functions as described herein. As a result, the examples of the present disclosure improve the operation and functioning of the general-purpose computer to schedule simultaneous optimization of multiple very-large-scale integration designs.

As depicted in FIG. 12, the computer or system 1200 comprises a hardware processor element 1202 (e.g., a central processing unit (CPU), a microprocessor, or a multi-core processor), a memory 1204, e.g., random access memory (RAM) and/or read only memory (ROM), a module 1205 for scheduling simultaneous optimization of multiple VLSI designs, and various input/output devices 1206 (e.g., storage devices, including but not limited to, a tape drive, a floppy drive, a hard disk drive or a compact disk drive, a receiver, a transmitter, a speaker, a display, a speech synthesizer, an output port, an input port and a user input device (such as a keyboard, a keypad, a mouse, a microphone and the like)). Although only one processor element is shown, it should be noted that the general-purpose computer may employ a plurality of processor elements. Furthermore, although only one general-purpose computer is shown in the figure, if the method(s) as discussed above is implemented in a distributed manner for a particular illustrative example, i.e., the steps of the above method(s) or the entire method(s) are implemented across multiple general-purpose computers, then the general-purpose computer of this figure is intended to represent each of those multiple general-purpose computers.

It should be noted that the present disclosure can be implemented in software and/or in a combination of software and hardware, e.g., using application specific integrated circuits (ASIC), a general purpose computer or any other hardware equivalents, e.g., computer readable instructions pertaining to the respective systems and/or methods discussed above can be used to configure a hardware processor to perform the steps functions and/or operations of the above disclosed systems and methods. In one embodiment, instructions and data for the present module or process 1205 for scheduling simultaneous optimization of multiple VLSI designs (e.g., a software program comprising computer-executable instructions) can be loaded into memory 1204 and executed by hardware processor element 1202 to implement the steps, functions or operations as discussed above in connection with the exemplary system 100 and/or methods 300, 500-900, and 1100. The processor executing the computer readable or software instructions relating to the above described method(s) can be perceived as a programmed processor or a specialized processor. As such, the present module 1205 for scheduling simultaneous optimization of multiple VLSI designs (including associated data structures) of the present disclosure can be stored on a tangible or physical (broadly non-transitory) computer-readable storage device or medium, e.g., volatile memory, non-volatile memory, ROM memory, RAM memory, magnetic or optical drive, device or diskette and the like. More specifically, the computer-readable storage device may comprise any physical devices that provide the ability to store information such as data and/or instructions to be accessed by a processor or a computing device such as a computer or an application server. In addition, it should be noted that the hardware processor can be configured or programmed to cause other devices to perform one or more operations as discussed above. In other words, the hardware processor may serve the function of a central controller directing other devices to perform the one or more operations as discussed above.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A computer-implemented method, comprising:
   obtaining a plurality of synthesis scenarios associated with a very-large-scale integration design, wherein each synthesis scenario of the plurality of synthesis scenarios describes a different combination of tunable design parameters for a macro of the very-large-scale integration design, and wherein the very-large-scale integration design includes a plurality of macros being tuned;
   ranking the plurality of macros, before the plurality of synthesis scenarios is submitted for synthesis by a synthesis tuning system, wherein the ranking produces a macro waiting list, and wherein the macro waiting list identifies those of the plurality of synthesis scenarios that are associated with each of the plurality of macros;
   pushing a subset of the plurality of synthesis scenarios from the macro waiting list to a job submission queue, wherein the job submission queue ranks the subset of the plurality of synthesis scenarios in an order in which the subset of the plurality of synthesis scenarios is to be synthesized by the synthesis tuning system;
   submitting a synthesis scenario of the subset of the plurality of synthesis scenarios to the synthesis tuning system according to the order;
   tuning the design parameters of the very-large-scale integration design based on a result of the synthesis tuning run; and
   fabricating an integrated circuit according to the design parameters of the very-large-scale integration as tuned.

2. The computer-implemented method of claim 1, further comprising:
   monitoring an availability of computing resources for use by the synthesis tuning system to perform synthesis tuning runs for the plurality of synthesis scenarios,
   wherein the submitting is performed when the monitoring indicates that a sufficient amount of the computing resources is available to perform a synthesis tuning run for the synthesis scenario.

3. The computer-implemented method of claim 1, further comprising:
   freeing any of the computing resources used to perform the synthesis tuning run upon completion of the synthesis tuning run.

4. The computer-implemented method of claim 1, wherein the ranking the plurality of macros is based at least in part on a program rule of the synthesis tuning system.

5. The computer-implemented method of claim 1, wherein the ranking the plurality of macros is based at least in part on a resource limit of the synthesis tuning system.

6. The computer-implemented method of claim 1, wherein the ranking the plurality of macros is based at least in part on an instruction from a human designer of at least one of the plurality of macros.

7. The computer-implemented method of claim 1, wherein the ranking the plurality of macros comprises:
computing a tuning potential for each macro of the plurality of macros; and
prioritizing those of the plurality of macros for which the tuning potential is highest.

8. The computer-implemented method of claim 7, wherein the tuning potential for a given macro of the plurality of macros is computed as a sum of two quantities, wherein the first quantity is an average quality of results improvement of optimal synthesis scenarios for the given macro over a default synthesis scenario for the given macro, and the second quantity is standard deviation of the quality of results improvement.

9. The computer-implemented method of claim 8, further comprising, prior to the computing:
submitting each macro of the plurality of macros to the synthesis tuning system for a tuning run, wherein the tuning potential is computed from results of the tuning run.

10. The computer-implemented method of claim 1, wherein the ranking comprises:
computing a cost function for each macro of the plurality of macros; and
prioritizing those of the plurality of macros for which the cost function is highest.

11. The computer-implemented method of claim 10, wherein the cost function for a given macro of the plurality of macros is computed from results of a prior synthesis run for the given macro.

12. The computer-implemented method of claim 10, wherein the cost function is computed as a weighted sum of a plurality of cost metrics, wherein each cost metric of the plurality of cost metrics relates to one of the tunable design parameters, and wherein the cost function is defined by a human designer of at least one of the plurality of macros.

13. The computer-implemented method of claim 10, wherein the cost function is computed as a weighted sum of a plurality of cost metrics, wherein each cost metric of the plurality of cost metrics relates to one of the tunable design parameters, and wherein the weighted sum is normalized.

14. The computer-implemented method of claim 10, wherein the cost function is computed as a weighted sum of a plurality of cost metrics, wherein each cost metric of the plurality of cost metrics relates to one of the tunable design parameters, and wherein the weighted sum is computed relative to an average of a value of the plurality of cost metrics across all macros of the plurality of macros.

15. The computer-implemented method of claim 1, further comprising:
obtaining new data describing the plurality of synthesis scenarios; and
updating the macro waiting list in accordance with the new data, wherein the updating results in at least one of the plurality of macros moving to a new position in the macro waiting list; and
updating the job submission queue based on the updating of the macro waiting list.

16. The computer-implemented method of claim 15, wherein the updating comprises:
computing a tuning potential for each macro of the plurality of macros, using the new data; and
prioritizing those of the plurality of macros for which the tuning potential is highest.

17. The computer-implemented method of claim 15, wherein the updating comprises:
obtaining a new synthesis result associated with one of the plurality of macros;
identifying a best solution for the one of the plurality of macros, based on the new synthesis result;
replacing a current solution in the macro waiting list for the one of the plurality of macros with the best solution; and
re-ranking the plurality of macros based on the replacing.

18. The computer-implemented method of claim 1, wherein a number of the plurality of synthesis scenarios that can be concurrently managed by the job submission queue is limited.

19. The computer-implemented method of claim 18, wherein the number is dynamically partitioned among the subset of the plurality of synthesis scenarios.

20. A non-transitory machine-readable storage medium encoded with instructions executable by a processor, the non-transitory machine-readable storage medium comprising:
instructions to obtain a plurality of synthesis scenarios associated with a very-large-scale integration design, wherein each synthesis scenario of the plurality of synthesis scenarios describes a different combination of tunable design parameters for a macro of the very-large-scale integration design, and wherein the very-large-scale integration design includes a plurality of macros being tuned;
instructions to rank the plurality of macros, before the plurality of synthesis scenarios is submitted for synthesis by a synthesis tuning system, wherein the ranking produces a macro waiting list, and wherein the macro waiting list identifies those of the plurality of synthesis scenarios that are associated with each of the plurality of macros;
instructions to push a subset of the plurality of synthesis scenarios from the macro waiting list to a job submission queue, wherein the job submission queue ranks the subset of the plurality of synthesis scenarios in an order in which the subset of the plurality of synthesis scenarios is to be synthesized by the synthesis tuning system;
instructions to submit a synthesis scenario of the subset of the plurality of synthesis scenarios to the synthesis tuning system according to the order;
instructions to tune the design parameters of the very-large-scale integration design based on a result of the synthesis tuning run; and
instructions to fabricate an integrated circuit according to the design parameters of the very-large-scale integration as tuned.

* * * * *